(12) United States Patent
Ueda et al.

(10) Patent No.: US 8,206,076 B2
(45) Date of Patent: Jun. 26, 2012

(54) SUBSTRATE PROCESSING SYSTEM

(75) Inventors: Issei Ueda, Koshi (JP); Yasushi Hayashida, Koshi (JP); Akira Miyata, Koshi (JP); Kensei Yamamoto, Koshi (JP); Yuichi Yamamoto, Minato-ku (JP); Michiaki Matsushita, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 537 days.

(21) Appl. No.: 12/137,076

(22) Filed: Jun. 11, 2008

(65) Prior Publication Data
US 2009/0003825 A1  Jan. 1, 2009

(30) Foreign Application Priority Data
Jun. 29, 2007 (JP) ................................. 2007-172389

(51) Int. Cl.
*H01L 21/677* (2006.01)
(52) U.S. Cl. ........................ 414/217; 414/939
(58) Field of Classification Search ............ 414/217, 414/935, 939
See application file for complete search history.

(56) References Cited

U.S. PATENT DOCUMENTS

| | | | |
|---|---|---|---|
| 4,178,113 A * | 12/1979 | Beaver et al. | 406/10 |
| 5,387,265 A * | 2/1995 | Kakizaki et al. | 29/25.01 |
| 5,464,313 A * | 11/1995 | Ohsawa | 414/172 |
| 5,810,538 A * | 9/1998 | Ozawa et al. | 414/217 |
| 5,855,681 A * | 1/1999 | Maydan et al. | 118/719 |
| 5,961,323 A * | 10/1999 | Lee | 432/241 |
| 6,079,927 A * | 6/2000 | Muka | 414/217 |
| 6,264,705 B1 * | 7/2001 | Akimoto et al. | 29/25.01 |
| 6,309,116 B1 * | 10/2001 | Mahara et al. | 396/611 |
| 6,439,822 B1 * | 8/2002 | Kimura et al. | 414/331.04 |
| 6,655,891 B2 * | 12/2003 | Akimoto et al. | 414/217 |
| 6,852,601 B2 * | 2/2005 | Yoshida et al. | 438/308 |
| 6,981,832 B2 * | 1/2006 | Zinger et al. | 414/217 |
| 7,114,903 B2 * | 10/2006 | Harris et al. | 414/222.01 |
| 7,134,825 B1 * | 11/2006 | Schmutz et al. | 414/217.1 |
| 7,682,123 B2 * | 3/2010 | Bachrach | 414/416.03 |
| 7,740,437 B2 * | 6/2010 | De Ridder et al. | 414/217.1 |
| 7,925,377 B2 * | 4/2011 | Ishikawa et al. | 700/218 |
| 2005/0136591 A1 * | 6/2005 | An | 438/255 |

(Continued)

FOREIGN PATENT DOCUMENTS

JP  4-352343  12/1992

(Continued)

OTHER PUBLICATIONS

Japanese Office Action issued Oct. 6, 2009, in Patent Application No. 2007-172389 (with English-language translation).

*Primary Examiner* — Joshua Rudawitz
(74) *Attorney, Agent, or Firm* — Oblon, Spivak, McClelland, Maier & Neustadt, L.L.P.

(57) ABSTRACT

A cassette waiting block is connected to a transfer in/out block of a coating and developing treatment system, and in the cassette waiting block, a cassette transfer in/out unit, a cassette waiting unit, a cassette delivery unit, and a substrate processing unit are provided. In the cassette waiting block, a cassette transfer unit for transferring the cassette between the cassette transfer in/out unit, the cassette waiting unit, and the cassette deliver unit, and a transfer unit for transferring the substrate between the cassette in the cassette waiting unit and the substrate processing unit are provided. Each cassette waiting unit has an opening mechanism for opening a port of the cassette.

15 Claims, 13 Drawing Sheets

U.S. PATENT DOCUMENTS

| | | | |
|---|---|---|---|
| 2008/0134483 A1* | 6/2008 | Aburatani | 29/25.01 |
| 2009/0185892 A1* | 7/2009 | Aburatani | 414/806 |
| 2010/0111648 A1* | 5/2010 | Tamura et al. | 414/217 |

FOREIGN PATENT DOCUMENTS

| | | |
|---|---|---|
| JP | 2000-100718 | 4/2000 |
| JP | 2000-124301 | 4/2000 |
| JP | 2002-124301 | 4/2000 |
| JP | 2002-16055 | 1/2002 |
| JP | 2002-246439 | 8/2002 |
| JP | 2003-60002 | 2/2003 |
| JP | 2003-151950 | 5/2003 |

* cited by examiner

SUBSTRATE PROCESSING SYSTEM

BACKGROUND OF THE INVENTION

1. Field of the Invention

The present invention relates to a substrate processing system for performing processing on a substrate.

2. Description of the Related Art

The photolithography processing in manufacturing process of, for example, a semiconductor device is usually performed using a coating and developing treatment system. The coating and developing treatment system includes, for example, a transfer in/out block for transferring in/out wafers in a cassette as a unit, a processing block in which a plurality of processing and treatment units for performing various kinds of processing and treatments such as a resist coating treatment, a developing treatment, thermal processing and so on are arranged, and an interface block for delivering the wafer between an adjacent aligner and the processing block.

In the coating and developing treatment system, the wafers are successively processed in a single-wafer mode. A plurality of wafers housed in a cassette in the transfer in/out block are, for example, successively transferred to the processing block, and predetermined processing and treatment such as the resist coating treatment, the thermal processing and so on are sequentially performed on each of the wafers in respective processing and treatment units in the processing block. Thereafter, each of the wafers is transferred via the interface block to the aligner and subjected to exposure processing. The wafer is then returned again into the processing block and subjected to predetermined processing and treatment such as the developing treatment and so on in the processing and treatment units. The wafers are then successively returned from the processing block to the transfer in/out block and housed into the cassette.

In the above-described coating and developing treatment system, processing adapted for a small lot is demanded because of diversification in device product in recent years. In this case, the number of wafers to be housed in one cassette is reduced, and therefore a larger number of cassettes need to wait in the system to transfer the wafers in the plurality of cassettes to the processing block so as not to make any time interval therebetween. Hence, it is proposed to provide a stocker for the cassettes, for example, in the processing system (Japanese Patent Application Laid-open No. 2000-124301).

SUMMARY OF THE INVENTION

However, when it is tried to keep many cassettes waiting in the coating and developing treatment system as described above, an accordingly larger number of cassettes are transferred into the system at an earlier stage and therefore many wafers therein will wait for start of the processing. On the other hand, it is required in recent years, to further increase the substrate processing efficiency in the coating and developing treatment system.

The present invention has been developed in consideration of the above points and its object is to further increase the substrate processing efficiency in a substrate processing system such as the coating and developing treatment system, utilizing the waiting time of substrates such as wafers.

A present invention to achieve the above object is a substrate processing system including a processing block for processing substrates in a single-substrate mode, and a transfer in/out block for transferring the substrates into/from the processing block, the blocks being adjacent to each other, wherein the transfer in/out block has a cassette mounting unit for mounting thereon a cassette housing a plurality of substrates and is capable of transferring the substrates from/into the cassette on the cassette mounting unit into/from the processing block, wherein a cassette waiting block is provided adjacent to the transfer in/out block, and wherein in the cassette waiting block, cassette waiting units for keeping a plurality of cassettes waiting, a cassette delivery unit for delivering the cassette to/from the transfer in/out block, and a substrate processing unit for performing predetermined processing on the substrates before the cassette is transferred into the transfer in/out block are provided.

According to the present invention, the substrate processing unit is provided in the cassette waiting block, so that a part of the substrate processing to be performed in the substrate processing system can be performed, for example, during waiting of the cassette. Therefore, the waiting time of the cassette can be effectively utilized to increase the substrate processing efficiency in the substrate processing system to improve the productivity of substrate products.

According to another aspect, the present invention is a substrate processing system including a processing block for processing substrates in a single-substrate mode, and a transfer in/out block for transferring the substrates into/from the processing block, the blocks being adjacent to each other, wherein in the transfer in/out block, cassette waiting units for keeping a plurality of cassettes waiting, each cassette capable of housing a plurality of substrates, a cassette mounting unit for mounting a cassette thereon to deliver the substrate to/from the processing block, and a substrate processing unit for performing predetermined processing on the substrates before transferred into the processing block are provided.

According to the present invention, the substrate processing unit is provided in the transfer in/out block, so that a part of the substrate processing to be performed in the substrate processing system can be performed, for example, during waiting of the cassette. Therefore, the waiting time of the cassette can be effectively utilized to increase the substrate processing efficiency in the substrate processing system to improve the productivity of substrate products.

DETAILED DESCRIPTION OF THE INVENTION

Figure 1:
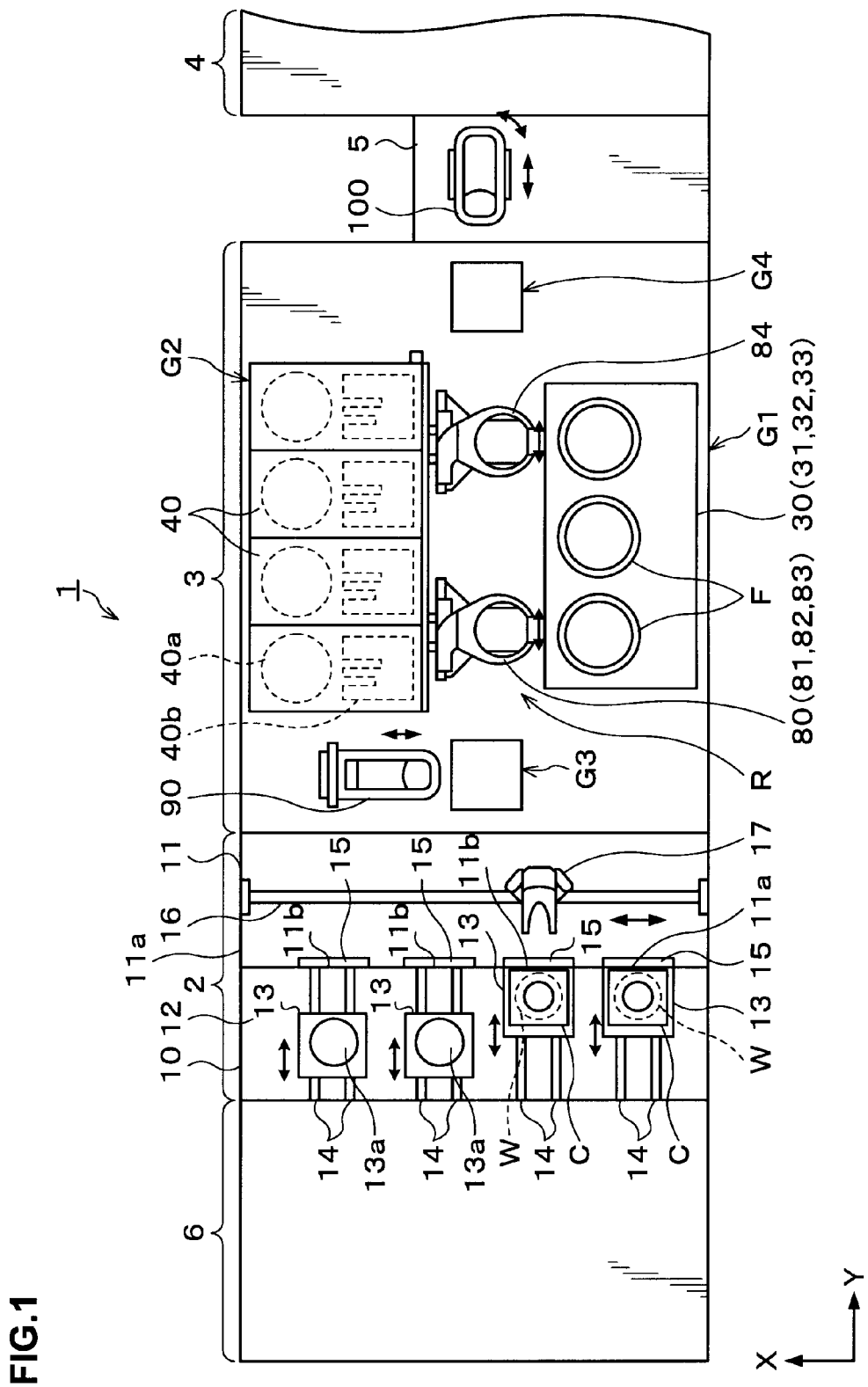
FIG. 1 is a plan view showing the outline of a configuration of a coating and developing treatment system.

Hereinafter, a preferred embodiment of the present invention will be described. FIG. 1 is a plan view showing the outline of a configuration of a coating and developing treatment system 1 as a substrate processing system according to the present invention.

The coating and developing treatment system 1 has, as shown in FIG. 1, a configuration in which, for example, a transfer in/out block 2 for transferring wafers W transferred in, for example, as a unit into/from a processing block; a processing block 3 including a plurality of various kinds of processing and treatment units for performing predetermined processing or treatment in a single-wafer mode in the photolithography processing; and an interface block 5 for delivering the wafers W to/from an aligner 4 adjacent to the processing block 3, are integrally connected together. The coating and developing treatment system 1 further has a cassette waiting block 6 where a plurality of cassettes C to be transferred into the transfer in/out block 2 are waiting, and the cassette waiting block 6 is connected to the transfer in/out block 2. Note that the cassette waiting block 6 may be detachable from the transfer in/out block 2.

Figure 2:
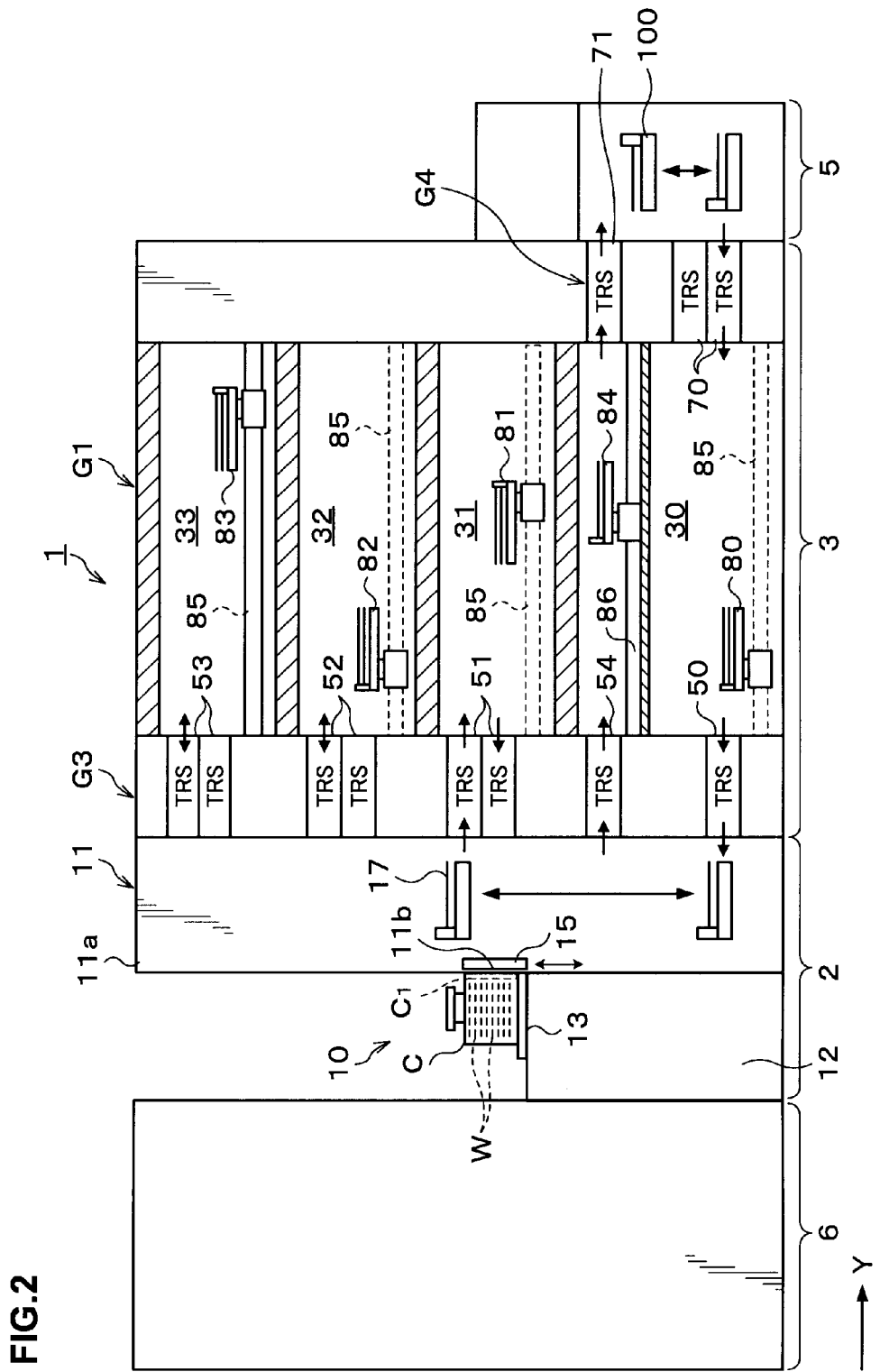
FIG. 2 is a side view showing the outline of the configuration of the coating and developing treatment system.

Explaining a configuration of the cassette C here, the cassette C is formed in a box shape capable of housing a plurality of wafers W arranged in the vertical direction, for example, as shown in FIG. 2. On one side surface of the cassette C, a door C1 is attached for permitting the wafer W to pass therethrough. On the top of the cassette C, a handle is provided which is held, for example, by a transfer arm when it is transferred.

The transfer in/out block 2 is divided, for example, into a cassette mounting region 10 and a wafer transfer region 11 as shown in FIG. 1. The cassette mounting region 10 and the wafer transfer region 11 are arranged in this order toward the processing block 3. In the cassette mounting region 10, as shown in FIG. 1 and FIG. 2, a cassette mounting table 12 is provided on which a plurality of, for example, four cassette mounting units 13 are provided. The cassette mounting units 13 are arranged in a line in an X-direction (a top-to-bottom direction in FIG. 1) in the horizontal direction as shown in FIG. 1. The cassette mounting unit 13 has, for example, a substantially square shape on which the cassette C can be mounted and secured. The cassette mounting unit 13 is movable, for example, on rails 14 extending in a Y-direction (a left-to-right direction in FIG. 1) and thus can move between the inside of the cassette waiting block 6 and the top of the cassette mounting table 12.

The wafer transfer region 11 is covered by a casing 11a for controlling the atmosphere. At positions in the casing 11a corresponding to the cassette mounting units 13 in the cassette mounting region 10, wafer transfer ports 11b are formed. On each of the wafer transfer ports 11b, a door opener 15 is provided for opening/closing the door C1 of the cassette C on the cassette mounting unit 13. The door opener 15 can hold and open the door C1 of the cassette C and retract the door C1 downward from the front (the opened portion) of the cassette C. The door opener 15 can return the retracted door C1 to the front of the cassette C to thereby close the door C1 of the cassette C. The door opener 15 has the same configuration as that of a later-described door opener 115.

In the casing 11a of the wafer transfer region 11, a wafer transfer unit 17 is provided which is movable on a transfer path 16 extending in the X-direction. The wafer transfer unit 17 has a transfer arm movable in the horizontal direction and the vertical direction and around a vertical axis (a θ-direction), and can transfer the wafer W between the cassette C on the cassette mounting unit 13 and a later-described delivery unit included in a third block G3 in the processing block 3.

In the processing block 3, a plurality of, for example, four blocks G1, G2, G3 and G4 are provided each including various kinds of units. For example, on the front side (the side of the negative direction in the X-direction in FIG. 1) in the processing block 3, the first block G1 is provided, and on the rear side (the side of the positive direction in the X-direction in FIG. 1) in the processing block 3, the second block G2 is provided. Further, on the transfer in/out block 2 side (the side of the negative direction in the Y-direction in FIG. 1) in the processing block 3, the third block G3 is provided, and on the interface block 5 side (the side of the positive direction in the Y-direction in FIG. 1) in the processing block 3, the fourth block G4 is provided.

For example, in the first block G1, as shown in FIG. 2, a plurality of solution treatment units, for example, a developing unit 30 for performing developing treatment on the wafer W, a lower anti-reflection film forming unit 31 for forming an anti-reflection film under a resist film above the wafer W (hereinafter, referred to as a "lower anti-reflection film"), a resist coating unit 32 for applying a resist solution onto the wafer W to form a resist film, and an upper anti-reflection film forming unit 33 for forming an anti-reflection film over the resist film above the wafer W (hereinafter, referred to as an "upper anti-reflection film"), are four-tiered in order from the bottom. There is a space, for example, between the developing unit 30 and the lower anti-reflection film forming unit 31, and a later-described shuttle transfer unit 84 is placed at the height of this space.

Each of the units 30 to 33 in the first block G1, for example, has a plurality of cups F each for housing the wafer W therein during treatment in the horizontal direction as shown in FIG. 1 to be able to treat a plurality of wafers W in parallel.

Figure 3:
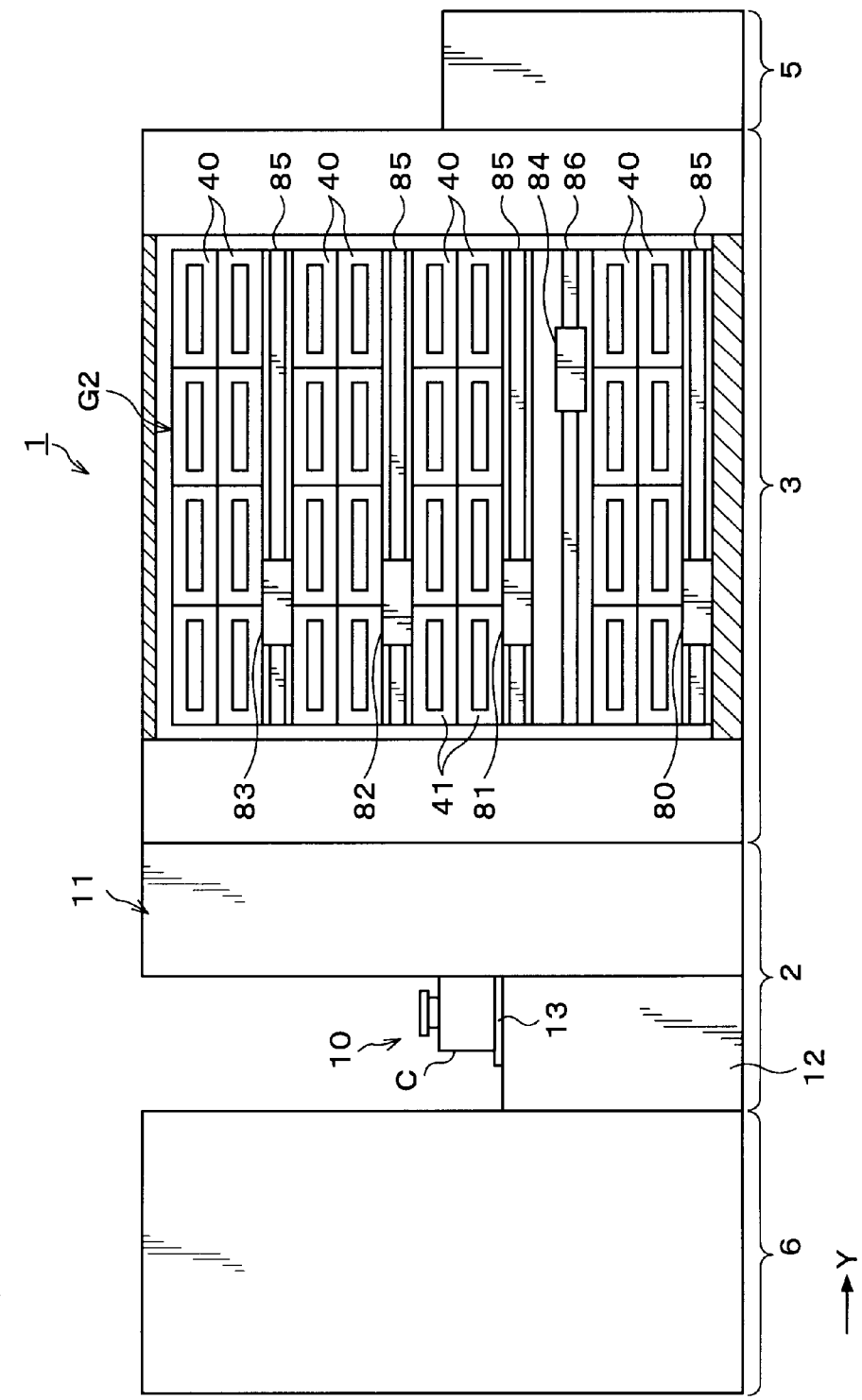
FIG. 3 is a side view showing a configuration of a second block of the coating and developing treatment system.

For example, in the second block G2, as shown in FIG. 3, thermal processing units 40 each for performing heat-processing for the wafer W, and adhesion units 41 are arranged in the vertical direction and in the horizontal direction. The thermal processing units 40 are provided, for example, at the heights corresponding to the units 30 to 33 in the first block G1. Note that the numbers and the arrangements of the thermal processing units 40 and the adhesion units 41 can be arbitrarily selected. For example, the thermal processing unit 40 has, as shown in FIG. 1, a thermal plate 40a for mounting and heating the wafer W thereon and a cooling plate 40a for mounting and cooling the wafer W thereon so as to be able to perform both heating and cooling.

For example, in the third block G3, as shown in FIG. 2, a plurality of delivery units 50, 51, 52, and 53 are provided in order from the bottom. The delivery units 50 to 53 are provided at the heights corresponding to the units 30 to 33 in the first block G1. Further, a delivery unit 54 is provided at a height similar to that of the shuttle transfer unit 84 between the developing unit 30 and the anti-reflection film forming unit 31.

For example, in the fourth block G4, a plurality of delivery units 70 and 71 are provided in order from the bottom. The delivery units 70 are provided at heights similar to that of the developing unit 30, and the delivery unit 71 is provided at a height similar to that of the shuttle transfer unit 84 in the first block G1.

As shown in FIG. 1, between the first block G1 and the second block G2, a transfer passage R extending in the Y-direction is provided. In the transfer passage R, for example, main transfer units 80, 81, 82, and 83 and the shuttle transfer unit 84 are arranged.

The main transfer units 80, 81, 82, and 83 are provided in order from the bottom, for example, as shown in FIG. 2, and provided at heights corresponding to the units 30, 31, 32, and 33 in the first block G1, respectively.

Figure 4:
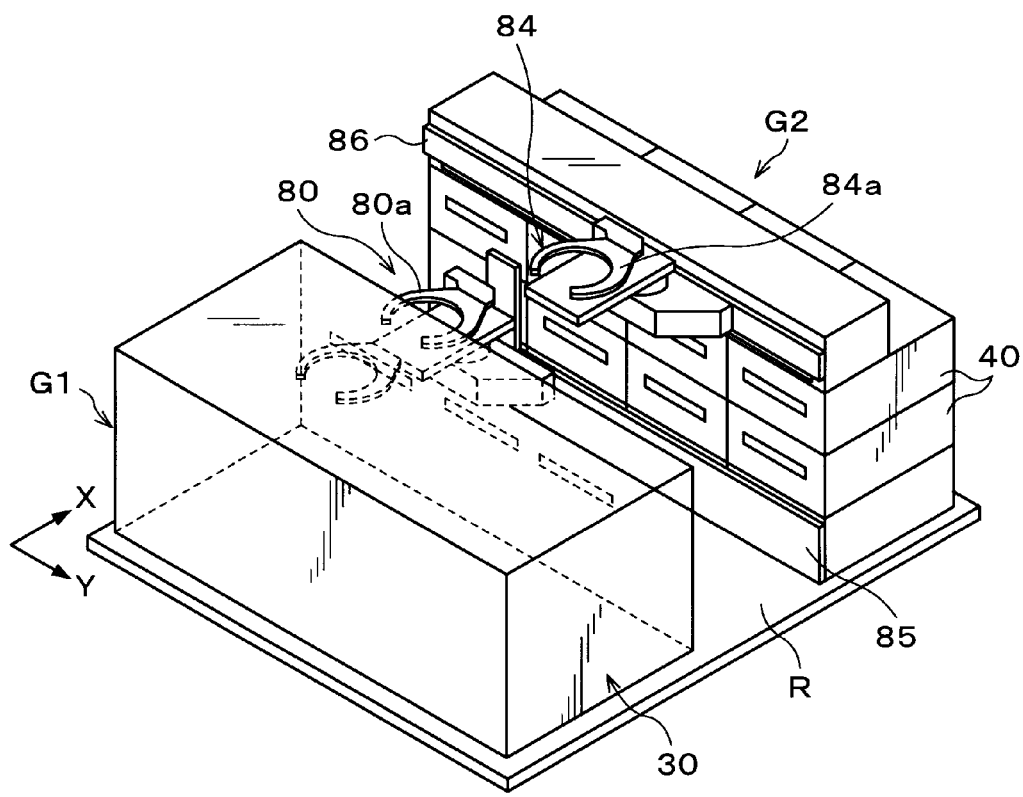
FIG. 4 is an explanatory view showing an arrangement of a developing unit in a first block, thermal processing units in the second block, a main transfer unit and a shuttle transfer unit.

For example, the main transfer unit 80 has a main transfer arm 80*a* that is movable in the vertical direction, the horizontal direction and the θ-direction, for example, as shown in FIG. 2 and FIG. 4. The main transfer unit 80 is movable on a rail 85 extending in the Y-direction attached to the second block G2, for example, as shown in FIG. 4. The main transfer unit 80 can move in the transfer passage R and transfer the wafer W between the units in the first block G1, the second block G2, the third block G3 and the fourth block G4. The main transfer units 81 to 83 have the same configuration as that of the main transfer unit 80 and can thus move on rails 85 extending in the Y-direction as shown in FIG. 2 and transfer the wafer W between the units in the first block G1, the second block G2, the third block G3 and the fourth block G4.

The shuttle transfer unit 84 is provided between the main transfer unit 80 and the main transfer unit 81. Not-shown partition plates are provided between the moving region of the shuttle transfer unit 84 and the moving region of the main transfer unit 80, and between the moving region of the shuttle transfer unit 84 and the moving region of the main transfer unit 81.

The shuttle transfer unit 84 has a shuttle transfer arm 84*a* that is movable in the horizontal direction and the θ-direction, for example, as shown in FIG. 4. The shuttle transfer unit 84 is movable on a rail 86 extending in the Y-direction attached to the second block G2, for example, as shown in FIG. 4. The shuttle transfer unit 84 can move in the transfer passage R and transfer the wafer W between the delivery unit 54 in the third block G3 and the delivery unit 71 in the fourth block G4.

As shown in FIG. 1, a wafer transfer unit 90 is provided adjacent to the third block G3. The wafer transfer unit 90 has a transfer arm that is movable in the vertical direction and the horizontal direction, for example, and can transfer the wafer W between the delivery units 50 to 54 in the third block G3.

In the interface block 5, a wafer transfer unit 100 is provided. The wafer transfer unit 100 has a transfer arm that is movable in the vertical direction, the horizontal direction and the θ-direction, and can transfer the wafer W between the aligner 4 adjacent to the interface block 5 and the delivery units 70 and 71 in the fourth block G4.

Figure 5:
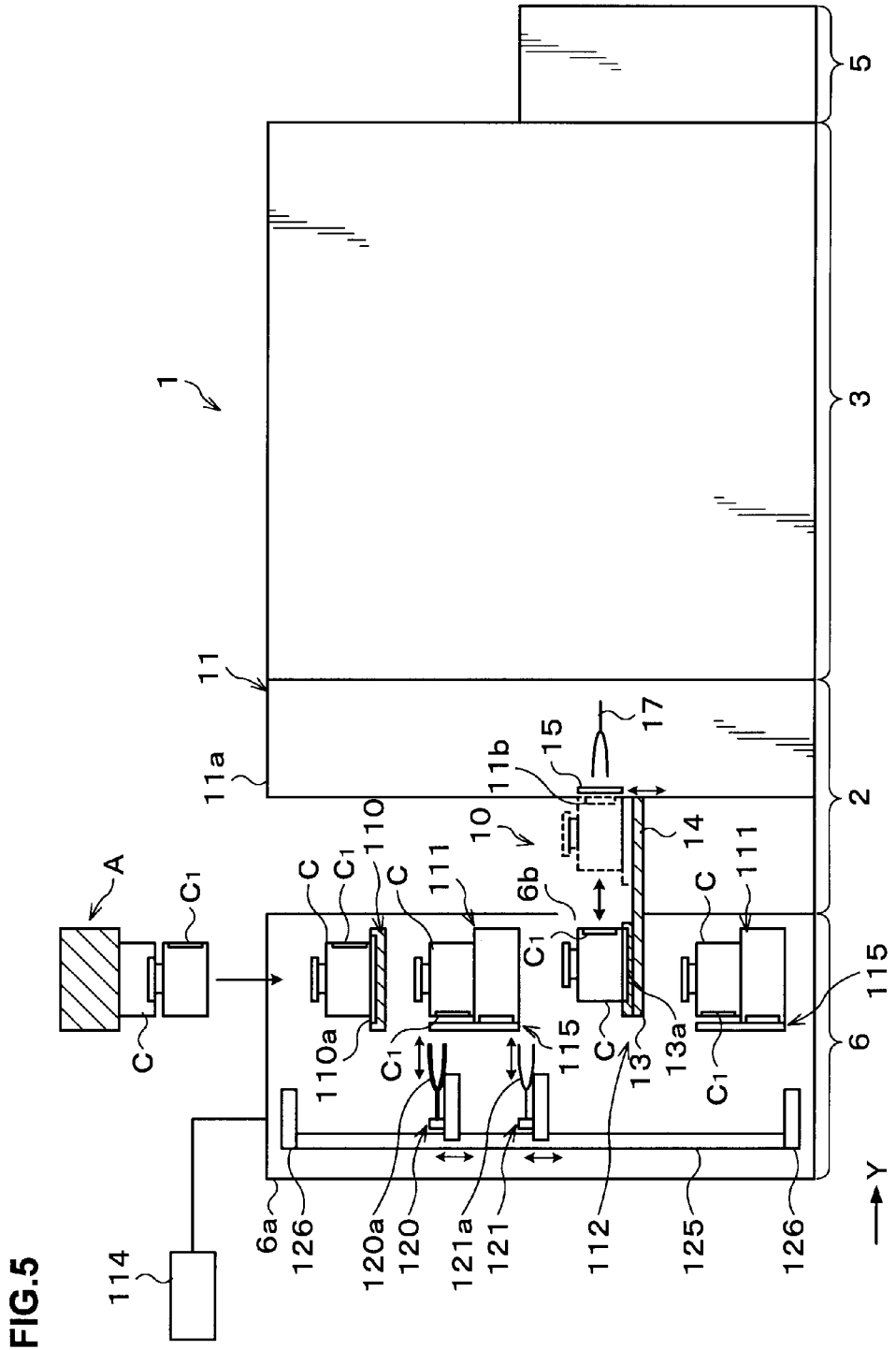
FIG. 5 is a side view showing the outline of a configuration of a cassette waiting block.
Figure 6:
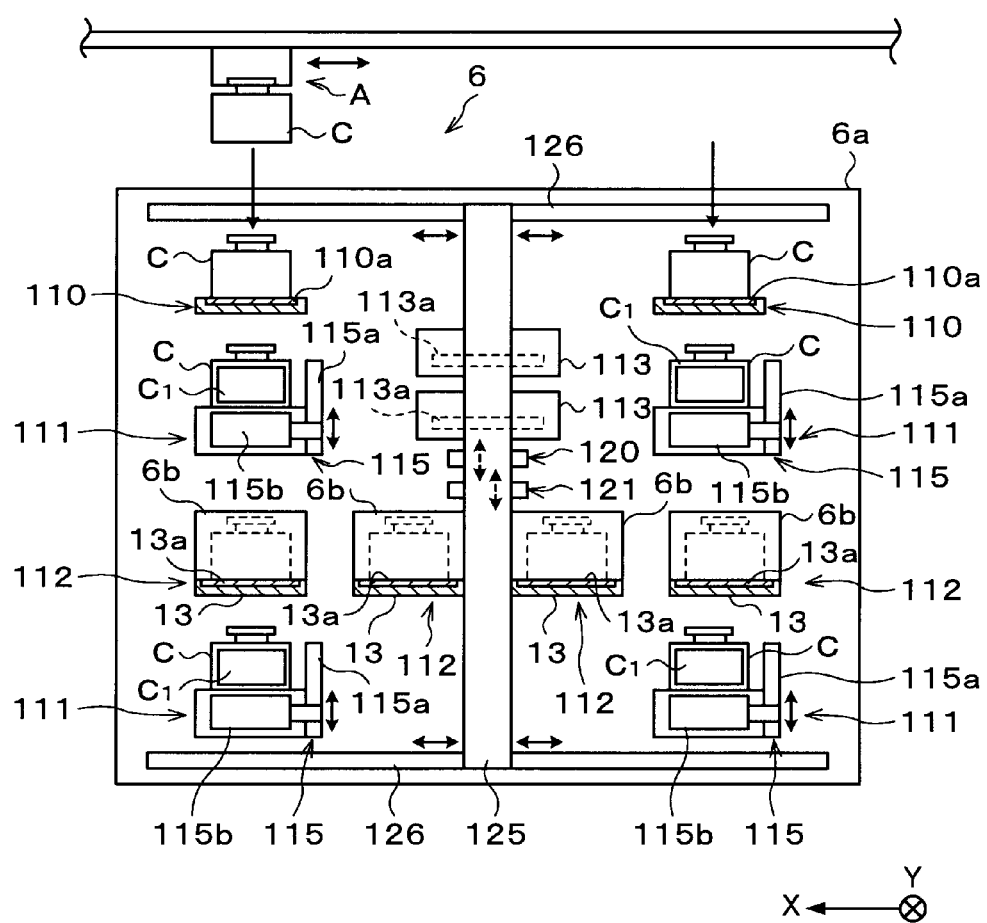
FIG. 6 is a side view as seen from the Y-direction, showing the outline of a configuration of the cassette waiting block.

The cassette waiting block 6 is covered by a casing 6*a* for controlling the atmosphere, for example, as shown in FIG. 5 and FIG. 6. In the casing 6*a*, cassette transfer in/out units 110, cassette waiting units 111, cassette delivery units 112, and wafer processing units 113 are provided. To the cassette waiting block 6, for example, a temperature regulator 114 is connected to be able to regulate the casing 6*a* to a predetermined temperature.

For example, the cassette transfer in/out units 110 are provided in the uppermost portion in the casing 6*a*. The ceiling portion of the casing 6*a* is formed with a transfer in/out port (not shown) for the cassette C. Above the cassette waiting block 6, a rail for an inter-unit cassette transfer unit A is located so that the inter-unit cassette transfer unit A can access the cassette transfer in/out unit 110 in the cassette waiting block 6 and transfer the cassette C into/from it.

Figure 7:
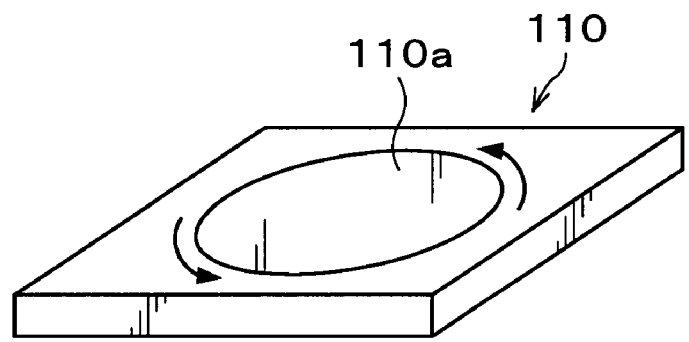
FIG. 7 is an explanatory view showing the outline of a configuration of a cassette transfer in/out unit.

The cassette transfer in/out unit 110 has, for example, a flat square disk shape as shown in FIG. 7 and is provided at the middle with a rotary table 110*a* as a cassette rotating member which rotates by means of a drive unit such as a motor. On the rotary table 110*a*, the cassette C can be mounted. The rotary table 110*a* can direct the door C1 of the cassette C in a predetermined direction.

The cassette transfer in/out units 110 are provided, for example, at two locations separated in the X-direction as shown in FIG. 6. The cassette waiting units 111 are provided, for example, in two tiers below each of the cassette transfer in/out units 110. Accordingly, in the cassette waiting block 6, two columns are provided in each of which the two-tiered cassette waiting units 111 and the cassette transfer in/out unit 110 are arrange in the vertical direction.

The cassette waiting unit 111 has, for example, a flat square disk shape and can mount the cassette C thereon. Each of the cassette waiting units 111 is provided with the door opener 115 as an opening/closing mechanism for opening/closing the door C1 of the cassette C. The door opener 115 has a rail 115*a*, for example, extending in the vertical direction and a door holding plate 115*b* movable on the rail 115*a*. The door holding plate 115*b* can retract downward while holding the door C1 of the cassette C on the cassette waiting unit 111 to thereby open the door C1 of the cassette C. Further, the door holding plate 115*b* holding the door C1 can rise and fit the door C1 into the opened portion of the cassette C to thereby close the door C1.

For example, the cassette delivery unit 112 is composed of the cassette mounting unit 13 in the above-described transfer in/out block 2. More specifically, a side wall of the casing 6*a* on the transfer in/out block 2 side is formed with cassette transfer in/out ports 6*b* at positions corresponding to the cassette mounting units 13, and the rails 14 for the cassette mounting units 13 pass through the cassette transfer in/out ports 6*b* and extend into the casing 6*a* as shown in FIG. 5. This allows the cassette mounting unit 13 to enter the cassette waiting block 6 from the transfer in/out block 2 side so that the cassette C can be delivered to the cassette mounting unit 13 entered into the cassette waiting block 6. The cassette delivery units 112 are provided, for example, at four locations along the X-direction, for example, at a height between the two-tiered cassette waiting units 111 as shown in FIG. 6. The cassette delivery unit 112 (the cassette mounting unit 13) is provided with a rotary table 13*a* and thus can change the orientation of the cassette C.

The wafer processing units 113 are provided, for example, at the middle between the cassette transfer in/out units 110 and the cassette waiting units 111 in the two, right and left, columns in the X-direction. The wafer processing units 113 are provided in two, upper and lower, tiers. The wafer processing unit 113 has, for example, a temperature regulating plate 113*a* for mounting and temperature-regulating the wafer W thereon, and thus can perform temperature regulation processing in a single-wafer mode for the wafers W before transferred into the processing block.

In the cassette waiting block 6, a cassette transfer unit 120 as a cassette transfer mechanism and a wafer transfer unit 121 are provided. The cassette transfer unit 120 and wafer transfer unit 121 are attached to a vertical rail 125 extending in the vertical direction and are thus movable in the vertical direction. Further, the vertical rail 125 is attached to a horizontal rail 126 extending in the X-direction, so that the cassette transfer unit 120 and the wafer transfer unit 121 are movable also in the X-direction. Each of the cassette transfer unit 120 and the wafer transfer unit 121 has a transfer arm advancing and retracting in the Y-direction that is the horizontal direction as shown in FIG. 5. The cassette transfer unit 120 has a transfer arm 120a capable of holding the cassette C, and the wafer transfer unit 121 has a transfer arm 121a capable of holding the wafer W. Accordingly, the cassette transfer unit 120 can transfer the cassette C between the cassette transfer in/out unit 110, the cassette waiting unit 111, and the cassette delivery unit 112. The wafer transfer unit 121 can transfer the wafer W between the cassette C on the cassette waiting unit 111 and the wafer processing unit 113.

Next, the operation of the coating and developing treatment system 1 configured as described above will be described.

First, a cassette C housing unprocessed wafers W is transferred by the inter-unit cassette transfer unit A to above the cassette waiting block 6 of the coating and developing treatment system 1 and then mounted on the rotary table 110a of the cassette transfer in/out unit 110. Thereafter, the cassette C is rotated 180 degrees by the rotary table 110a in the cassette transfer in/out unit 110 so that the door C1 is directed toward the wafer transfer unit 121. Thereafter, the cassette C is transferred by the cassette transfer unit 120 to one of the cassette waiting portions 111. In this manner, the cassettes C are transferred into the cassette waiting block 6 in sequence and stored in the cassette waiting units 111 and wait there.

During waiting in the cassette waiting unit 111, the door C1 of the cassette C is opened by the door opener 115. The wafers W in the cassette C are then transferred by the wafer transfer unit 121 one by one to the wafer processing unit 113 and temperature-regulated in the wafer processing unit 113. The wafer W is then returned by the wafer transfer unit 121 to the original cassette C in the cassette waiting unit 111. After all of the wafers W are returned into the cassette C, the door C1 of the cassette C is closed by the door opener 115.

Thereafter, when the turn of that cassette C for lot processing comes, the cassette C is mounted by the cassette transfer unit 120 on the cassette mounting unit 13 that is the cassette deliver unit 112. The cassette C is then rotated 180 degrees by the rotary table 13a so that the door C1 is directed toward the transfer in/out block 2. The cassette mounting unit 13 then moves in the Y-direction, whereby the cassette C is transferred from the cassette waiting block 6 to the transfer in/out block 2 and fitted into the wafer transfer port 11b of the casing 11a. The door C1 of the cassette C is opened by the door opener 15, and the wafer W in the cassette C is transferred by the wafer transfer unit 17 in the wafer transfer region 11 into the processing block 3.

The wafer W is transferred by the wafer transfer unit 17 to the deliver unit 51 in the third block G3 of the processing block 3. The wafer W is then transferred, for example, by the main transfer unit 81 to the adhesion unit 41 in the second block G2 and subjected to adhesion treatment. The wafer W is subsequently transferred by the main transfer unit 81, for example, to the thermal processing unit 40 and temperature-regulated. The wafer W is then transferred by the main transfer unit 81, for example, to the lower anti-reflection film forming unit 31 in the first block G1 where a lower anti-reflection film is formed on the wafer W. The wafer W is then transferred to the thermal processing unit 40 in the second block G2 and heated, and then returned to the delivery unit 51.

Subsequently, the wafer W is transferred by the wafer transfer unit 90 to the delivery unit 52. The wafer W is then transferred by the main transfer unit 82 to the resist coating unit 32, where a resist film is formed above the wafer W. The wafer W is then transferred by the main transfer unit 82 to the thermal processing unit 40 and heated (pre-baking processing) and then returned to the delivery unit 52.

Subsequently, the wafer W is transferred by the wafer transfer unit 90 to the delivery unit 53. The wafer W is then transferred by the main transfer unit 83 to the upper anti-reflection forming unit 33, where an upper anti-reflection film is formed above the wafer W. The wafer W is then transferred by the main transfer unit 83 to the thermal processing unit 40 and heated, and then returned to the delivery unit 53.

The wafer W is then transferred by the wafer transfer unit 90 to the delivery unit 54, and transferred by the shuttle transfer unit 84 to the delivery unit 71 in the fourth block G4. The wafer W is then transferred by the wafer transfer unit 100 in the interface block 5 to the aligner 4 and subjected to exposure processing therein.

Subsequently, the wafer W is transferred by the wafer transfer unit 100 from the aligner 4 to the delivery unit 70 in the fourth block G4 of the processing block 3. The wafer W is then transferred by the main transfer unit 80 to the thermal processing unit 40 and heated (post-exposure baking processing). The wafer W is then transferred by the main transfer unit 80 to the developing unit 30 and developed. After the development, the wafer W is transferred by the main transfer unit 80 to the thermal processing unit 40 and heated (post-baking processing).

The wafer W is then transferred by the main transfer unit 80 to the delivery unit 50 in the third block G3, and then returned by the wafer transfer unit 17 in the transfer in/out block 2 to the cassette C on the cassette mounting unit 13. After all of the wafers W are returned into the cassette C, the door C1 of the cassette C is closed by the door opener 15. The cassette mounting unit 13 then moves, whereby the cassette C is transferred into the cassette waiting block 6, and the cassette C is transferred by the cassette transfer unit 120 to the cassette transfer in/out unit 110. The cassette C is then transferred out by the inter-unit cassette transfer unit A from the cassette transfer in/out unit 110 to the outside of the coating and developing treatment system 1.

According to the above embodiment, the wafer processing units 113 are provided in the cassette waiting block 6 of the coating and developing treatment system 1, so that the first processing in the photolithography processing can be performed during waiting of the cassettes C before start of the lot processing. Thus, the waiting time of the cassettes C can be effectively utilized to increase the processing efficiency of the wafers W in the coating and developing treatment system 1.

The wafer transfer unit 121 is provided in the cassette waiting block 6 and thus can transfer the wafers W in the cassette C on the cassette waiting unit 111 one by one to the wafer processing unit 113. This allows the single-wafer processing in the wafer processing unit 113 to be appropriately performed.

Since the door opener 115 is provided for each cassette waiting unit 111, the wafer W in the cassette C can be taken out in each cassette waiting unit 111. This allows the wafer W to be transferred from the cassette C in each cassette waiting unit 111 to the wafer processing unit 113 and the single-wafer processing to be performed in the wafer processing unit 113.

Provision of the rotary table 110a in the cassette transfer in/out unit 110 makes it possible to change the orientation of the door C1 of the cassette C to the wafer transfer unit 121 side so that the wafer W in the cassette C can be appropriately taken out. Further, the capability of changing the orientation of the cassette C in the cassette transfer unit 110 eliminates the necessity of providing the rotary mechanism for the cassette C in each cassette transfer waiting unit 111, resulting in simplified configuration of the unit.

Provision of the cassette transfer unit 120 in the cassette waiting block 6 allows preferable transfer of the cassette C between the cassette transfer in/out unit 110, the cassette waiting unit 111, and the cassette deliver unit 112.

Arrangement of the cassette transfer in/out unit 110 and the cassette waiting units 111 in the vertical direction can suppress the footprint of the cassette waiting block 6.

Since the cassette transfer in/out units 110 are provided in the upper portion in the cassette waiting block 6, the transfer distance by the inter-unit cassette transfer unit A can be reduced to decrease the time required for transferring in/out the cassette C. This allows many cassettes C adapted for small lots to be transferred in/out in a short time.

Figure 8:
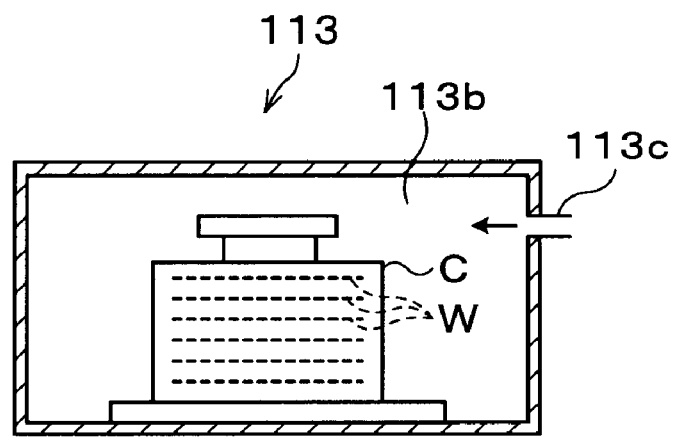
FIG. 8 is an explanatory view showing the outline of a configuration of a batch-type wafer processing unit.

Though the wafer processing unit 113 in the cassette waiting block 6 is of a single-wafer type in the above embodiment, it may be of a batch type. In this case, the wafer processing unit 113 may have a temperature regulating chamber 113b for accommodating the cassette C and temperature-regulating the whole cassette C as shown in FIG. 8. This temperature regulating chamber 113b has a function of setting the inside of the chamber at a predetermined temperature. The inside of the chamber may be set to the predetermined temperature, for example, by supplying a temperature-regulated gas from a gas supply unit 113c. In this case, the cassette C during waiting is transferred into and accommodated in the temperature-regulating chamber 113b of the wafer processing unit 113, whereby the wafers W in the cassette C can be collectively temperature-regulated. Also in this case, the temperature regulation processing for the wafer W that is the first processing of the photolithography processing can be performed during waiting of the cassette C in the cassette waiting block 6 to thereby increase the processing efficiency of the wafers W in the coating and developing treatment system 1. Further, as compared to the single-wafer type, it is unnecessary to provide the door opener 115 at each of the cassette waiting units 111, so that the structure can be simplified. Furthermore, the processing time can be made shorter in the batch type.

Though the cassette waiting block 6 is connected to the transfer in/out block 2 and the cassette waiting units 111 and the wafer processing units 113 are provided in the cassette waiting block 6 in the above embodiment, the cassette waiting units and the wafer processing units may be provided in the transfer in/out block 2.

Figure 9:
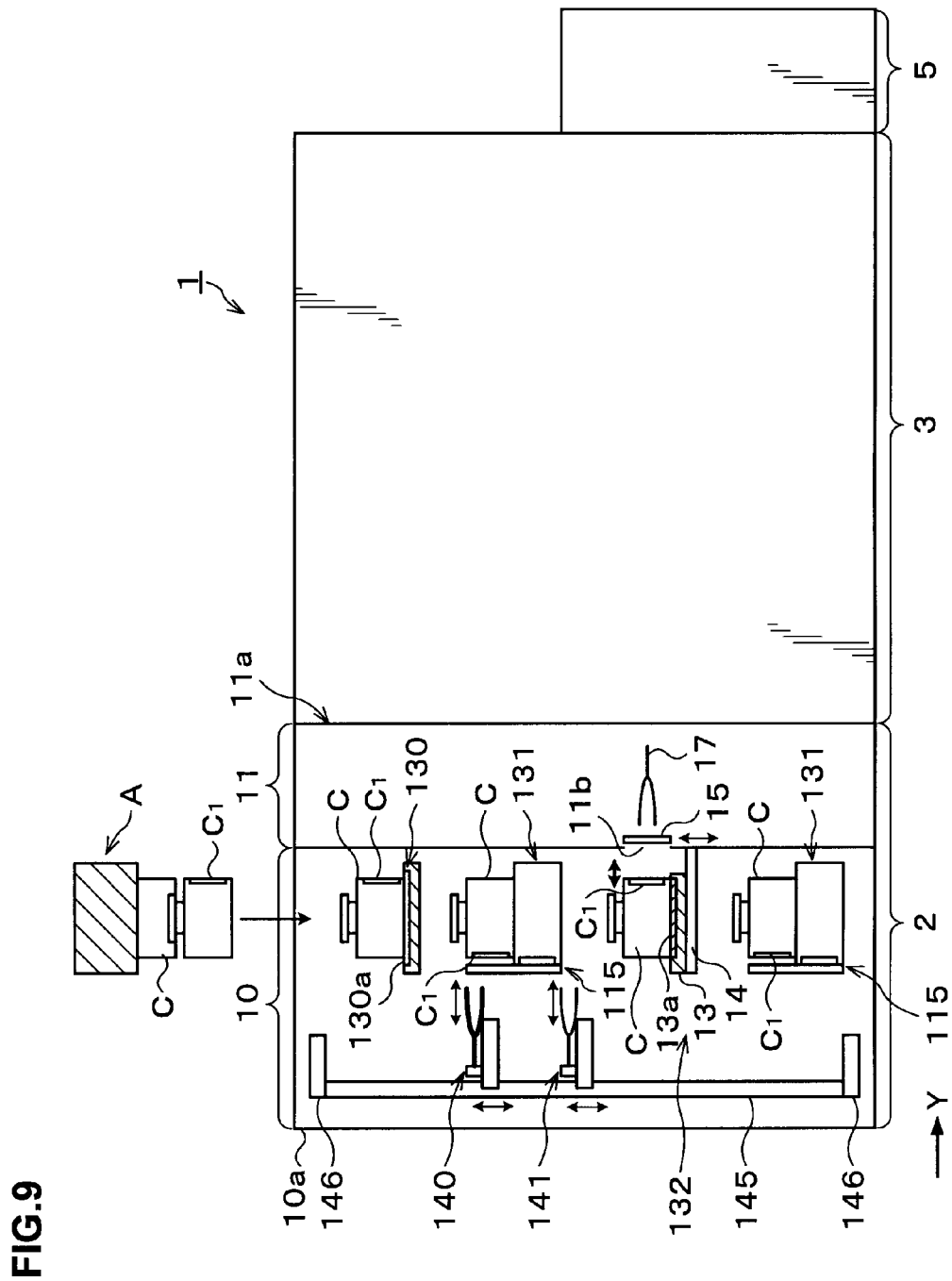
FIG. 9 is a side view showing the outline of a configuration of a transfer in/out block with cassette waiting units and wafer processing units.
Figure 10:
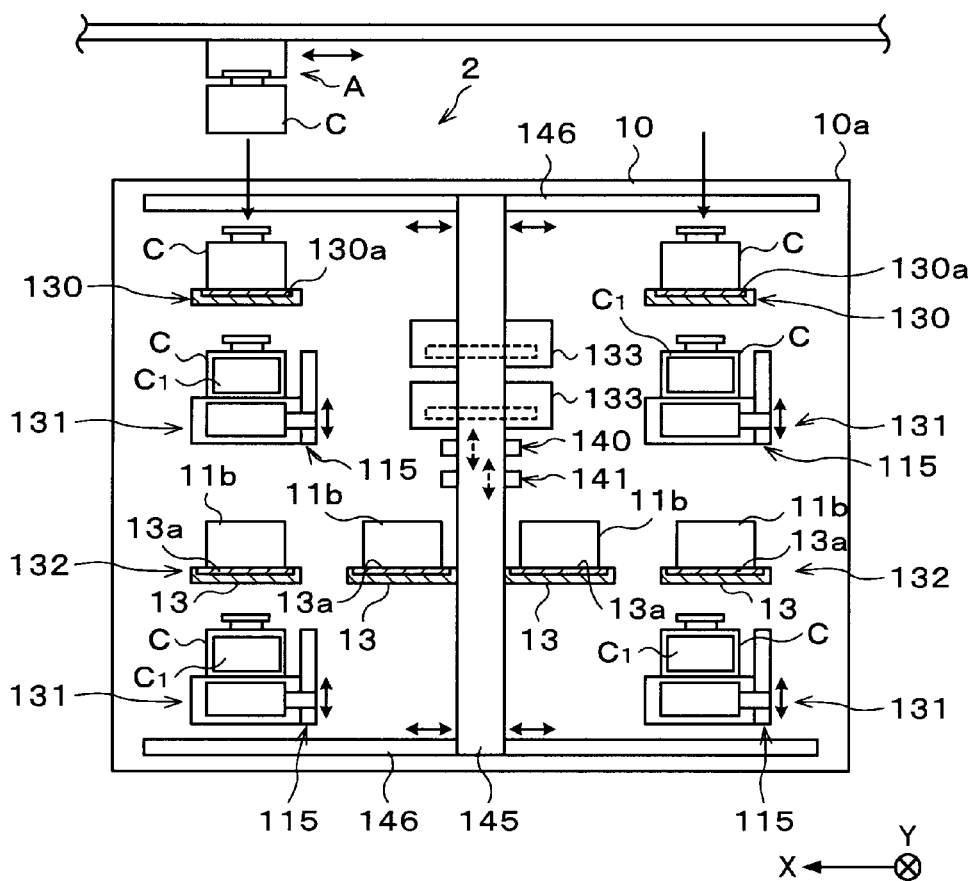
FIG. 10 is a side view as seen from the Y-direction, showing the outline of a configuration of a transfer in/out block.

FIG. 9 and FIG. 10 show an embodiment of that case. For example, the cassette mounting region 10 side of the transfer in/out block 2 is covered by a casing 10a and, in the casing 10a, cassette transfer in/out units 130, cassette waiting units 131, cassette mounting units 132, and wafer processing units 133 are provided. These cassette transfer in/out units 130, cassette waiting units 131, cassette mounting units 132, and wafer processing units 133 have, for example, the same configurations as those of the above-described cassette transfer in/out units 110, cassette waiting units 111, cassette delivery units 112, and wafer processing units 113.

For example, the cassette transfer in/out units 130 are provided in the uppermost portion in the casing 10a. The inter-unit cassette transfer unit A can access the cassette transfer in/out unit 130 and transfer the cassette C into/from it. The cassette transfer in/out units 130 are provided, for example, at two locations separated in the X-direction as shown in FIG. 10. The cassette transfer in/out unit 130 has, as in the above-described cassette transfer in/out unit 110, a rotary table 130a. The cassette waiting units 131 are provided, for example, in two, upper and lower, tiers below each of the cassette transfer in/out units 130. Each of the cassette waiting units 131 is provided with a door opener 115.

For example, the cassette mounting units 132 are provided at a height between the two-tiered cassette waiting units 131. Each of the cassette mounting units 132 is provided at a position corresponding to the wafer transfer port 11b of the casing 11a.

The wafer processing units 133 are provided, for example, at the middle between the cassette transfer in/out units 130 and the cassette waiting units 131 in the two, right and left, columns in the X-direction. The wafer processing units 133 are provided in two, upper and lower, tiers.

In the transfer in/out block 2, a cassette transfer unit 140 and a wafer transfer unit 141 are provided. The cassette transfer unit 140 and the wafer transfer unit 141 have, for example, the same configurations as those of the above-described cassette transfer unit 120 and wafer transfer unit 121. The cassette transfer unit 140 and the wafer transfer unit 141 can move their respective arms in the vertical direction and the horizontal direction via a vertical rail 145 and a horizontal rail 146.

In this example, the cassette C is transferred by the inter-unit cassette transfer unit A to above the transfer in/out block 2 of the coating and developing treatment system 1 and then mounted on the cassette transfer in/out unit 130. The cassette C is then rotated 180 degrees by the rotary table 130a in the cassette transfer in/out unit 130 so that the door C1 is directed toward the wafer transfer unit 141. Thereafter, the cassette C is transferred by the cassette transfer unit 140 to the cassette waiting unit 131. In this manner, the cassettes C are transferred into the transfer in/out block 2 in sequence and stored in the cassette waiting units 131 and wait there.

During waiting in the cassette waiting unit 131, the door C1 of the cassette C is opened by the door opener 115. The wafers W in the cassette C are then transferred by the wafer transfer unit 141 one by one to the wafer processing unit 133 and temperature regulated in the wafer processing unit 133. The wafer W is then returned by the wafer transfer unit 141 to the original cassette C in the cassette waiting unit 131. After all of the wafers W are returned into the cassette C, the door C1 of the cassette C is closed by the door opener 115.

Thereafter, when the turn of that cassette C for lot processing comes, the cassette C is mounted by the cassette transfer unit 140 on the cassette mounting unit 132. The cassette C is then rotated 180 degrees so that the door C1 is directed toward the wafer transfer region 11. The cassette mounting unit 132 then moves in the Y-direction and the cassette C is set in the wafer transfer port 11b. The door C1 of the cassette C is opened by the door opener 15, and the wafer W in the cassette C is transferred by the wafer transfer unit 17 in the wafer transfer region 11 into the processing block 3.

After completion in the processing block 3, the wafer W is returned into the cassette C on the cassette mounting unit 132. After all of the wafers W are returned into the cassette C, the cassette C is transferred by the cassette transfer unit 140 to the cassette transfer in/out unit 130, and then transferred out by the inter-unit cassette transfer unit A from the cassette transfer in/out unit 130 to the outside of the coating and developing treatment system 1.

According to the above embodiment, the cassette waiting units 131 and the wafer processing units 133 are provided in the transfer in/out block 2 of the coating and developing treatment system 1, so that the first processing in the photolithography processing can be performed during waiting of the cassettes C before start of the lot processing. Thus, the waiting time of the cassettes C can be effectively utilized to increase the processing efficiency in the coating and developing treatment system 1.

The wafer transfer unit 131 is provided in the transfer in/out block 2 and thus can transfer the wafers W in the cassette C on the cassette waiting unit 131 one by one to the wafer processing unit 133. This allows the single-wafer processing in the wafer processing unit 133 to be appropriately performed.

Since the door opener 115 is provided for each cassette waiting unit 131, the wafer W in the cassette C can be taken out in each cassette waiting unit 131. This allows the wafer W to be transferred from the cassette C in each cassette waiting unit 131 to the wafer processing unit 133 and the single-wafer processing to be performed in the wafer processing unit 133.

Provision of the rotary table 130a in the cassette transfer in/out unit 130 makes it possible to change the orientation of the door C1 of the cassette C to the wafer transfer unit 141 side so that the wafer W in the cassette C can be appropriately taken out. Further, the capability of changing the orientation of the cassette C in the cassette transfer unit 130 eliminates the necessity of providing the rotary mechanism for the cassette C in each cassette transfer waiting unit 131, resulting in simplified configuration of the unit.

Provision of the cassette transfer unit 140 in the transfer in/out block 2 allows preferable transfer of the cassette C between the cassette transfer in/out unit 130, the cassette waiting unit 131, and the cassette mounting unit 132.

Arrangement of the cassette transfer in/out unit 130 and the cassette waiting units 131 in the vertical direction can suppress the footprint of the transfer in/out block 2.

Since the cassette transfer in/out units 130 are provided in the upper portion in the transfer in/out block 2, the transfer distance by the inter-unit cassette transfer unit A can be reduced to decrease time required for transferring in/out many cassettes C.

The wafer processing unit 133 may be of a batch type also in this embodiment. In this case, the wafer processing unit 133 may have the same configuration as that of the above-described batch-type wafer processing unit 113. Also in this case, the temperature regulation processing for the wafer W that is the first processing of the photolithography processing can be performed during waiting of the cassette C in the transfer in/out block 2 to thereby increase the processing efficiency of the wafers W in the coating and developing treatment system 1. Further, as compared to the single-wafer type, it is unnecessary to provide the door opener 115 at each of the cassette waiting units 131, so that the structure can be simplified. Furthermore, the processing time can be made shorter in the batch type.

Figure 11:
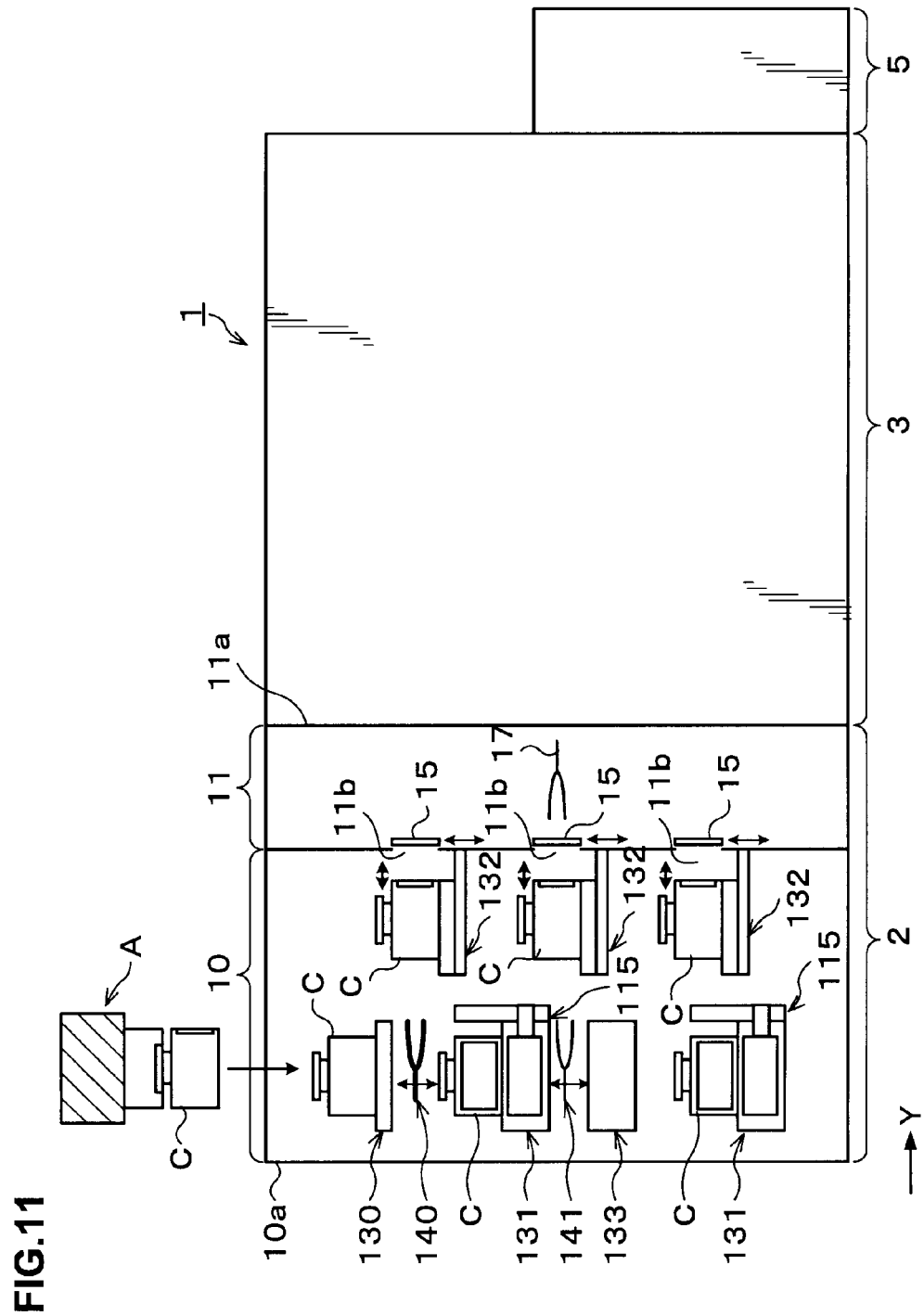
FIG. 11 is an explanatory view showing the outline of a configuration of the transfer in/out block when the cassette mounting units are provided in multiple tiers.
Figure 12:
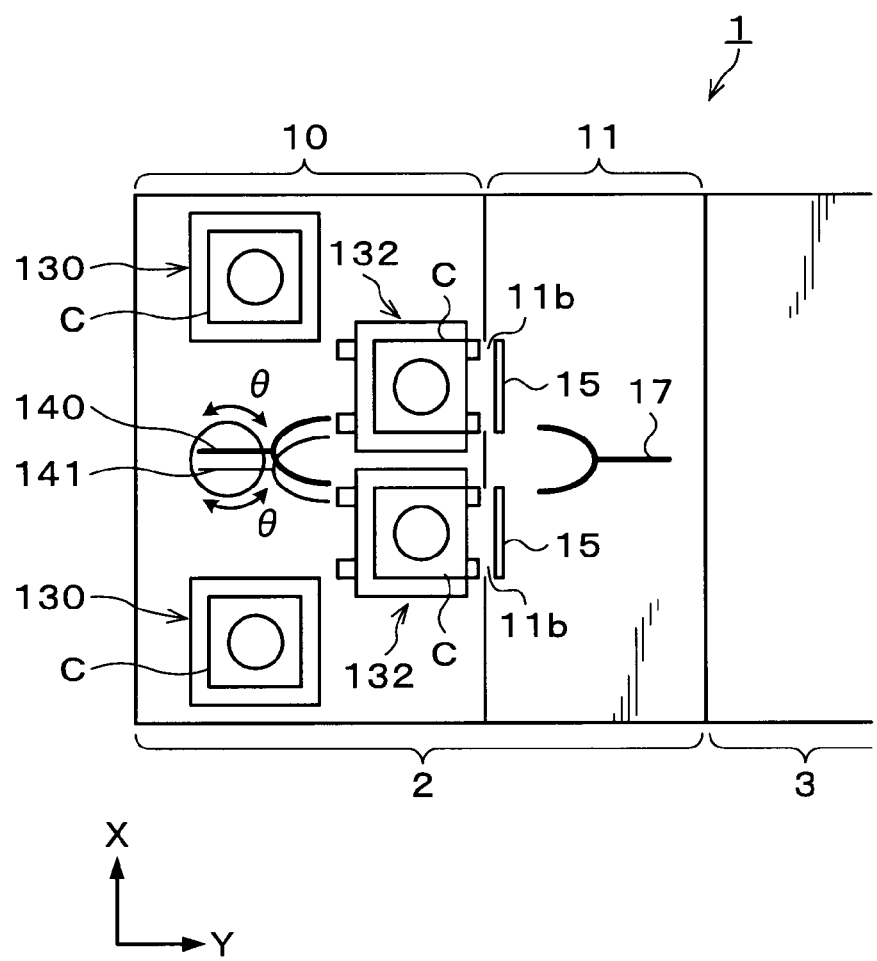
FIG. 12 is a plan view showing the outline of a configuration of the transfer in/out block when the cassette mounting units are provided in multiple tiers.

While the cassette mounting units 132 are provided in one tier in the above-described embodiments, they may be provided in multiple tiers in the vertical direction. FIG. 11 and FIG. 12 show one example of that case. For example, as shown in FIG. 11, the cassette mounting units 132 are provided in three tiers in the cassette mounting region 10. The wafer transfer port 11b and the door opener 15 in the wafer transfer region 11 are provided for each of the cassette mounting units 132. The wafer transfer unit 17 can transfer the wafer W to the cassettes C on all of the cassette mounting units 132.

As shown in FIG. 12, the cassette transfer unit 140 is provided near the middle of the cassette mounting region 10 and thus can transfer the cassette C to each of the cassette mounting units 132. The cassette transfer unit 140 is configured to be rotatable in the θ-direction around the vertical axis. On both sides of the cassette transfer unit 140 in the X-direction, the cassette waiting unit 131, the wafer processing unit 133, the cassette waiting unit 131, and the cassette transfer in/out unit 130 are provided in order from the bottom. The cassette transfer unit 140 can transfer the cassette C to each of the cassette transfer in/out units 130 and the cassette waiting units 131. Further, the wafer transfer unit 141 is configured to be rotatable in the θ-direction and thus can transfer the wafer W between the cassette waiting unit 131 and the wafer processing unit 133.

In this case, the cassette mounting units 132 can be arranged in multiple tiers and many cassettes C can therefore be mounted on the cassette mounting units 132, so that a larger number of cassettes C can be mounted at positions to which the wafer transfer unit 17 in the wafer transfer region 11 can access. This configuration makes it possible to transfer the wafers W in a plurality of cassettes C to the processing block 3 and process them without any time interval therebetween, even for processing of a small lot where the number of wafers in each of the cassettes C is small. As a result, the processing efficiency of the wafers W in the coating and developing treatment system 1 can be increased. Further, since the cassette mounting units 132 are arranged in multiple tiers, an increase in footprint can also be prevented.

Figure 13:
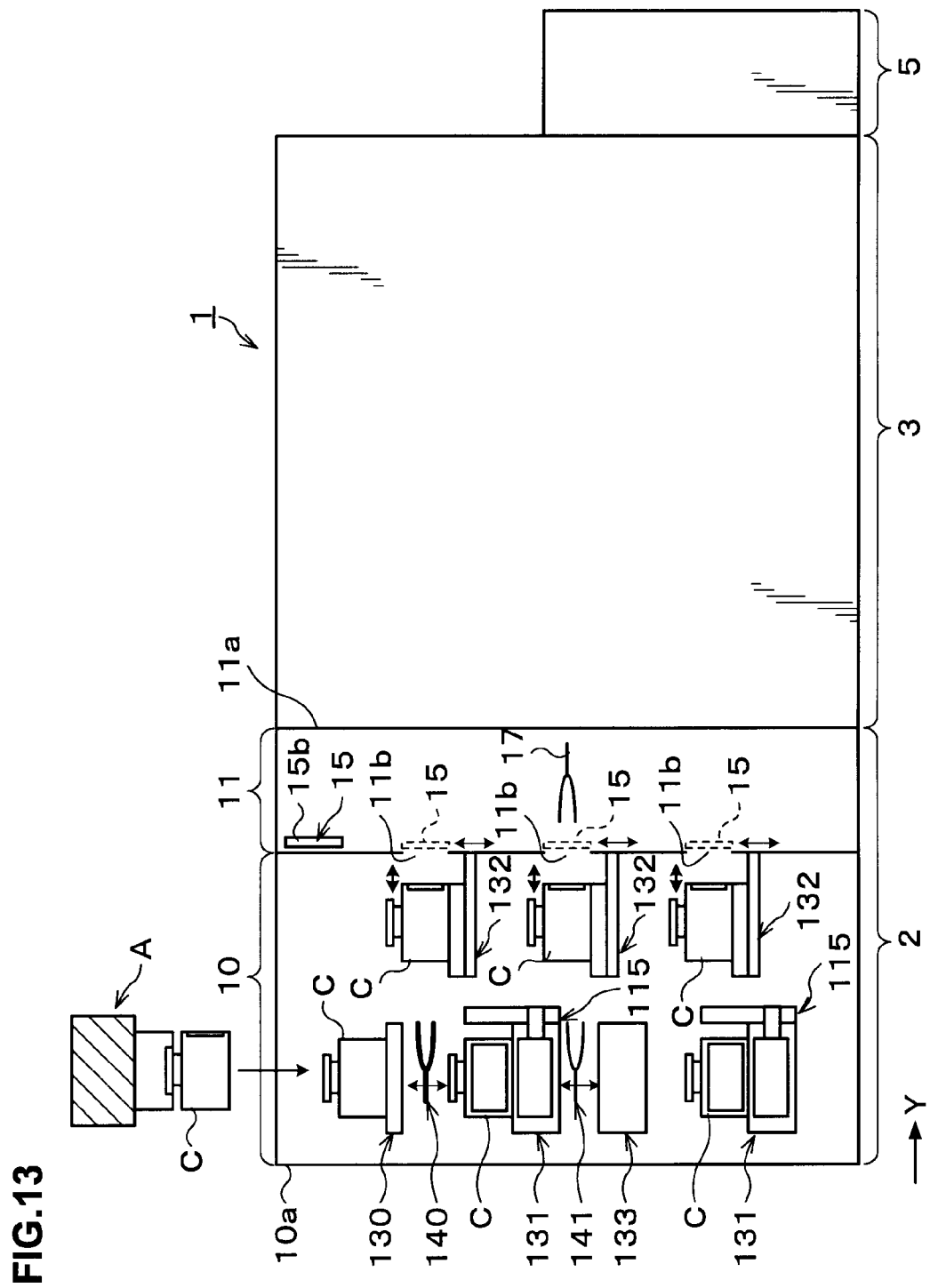
FIG. 13 is a side view showing a configuration of the transfer in/out block when a door opener retracts to an upper portion of the transfer in/out block.

Note that though a door holding plate of the door opener 15 in the wafer transfer region 11 retracts to below the respective cassette mounting unit 132 when opening the door C1 of the cassette C in the above embodiment, a door holding plate 15b of the door opener 15 may retract, for example, to a position above or below the wafer transfer region 11 as shown in FIG. 13. In this case, it is unnecessary to provide the retraction position of the door holding plate 15b for each of the cassette mounting units 132, so that a larger number of cassette mounting units 132 can be arranged in multiple tiers.

Figure 14:
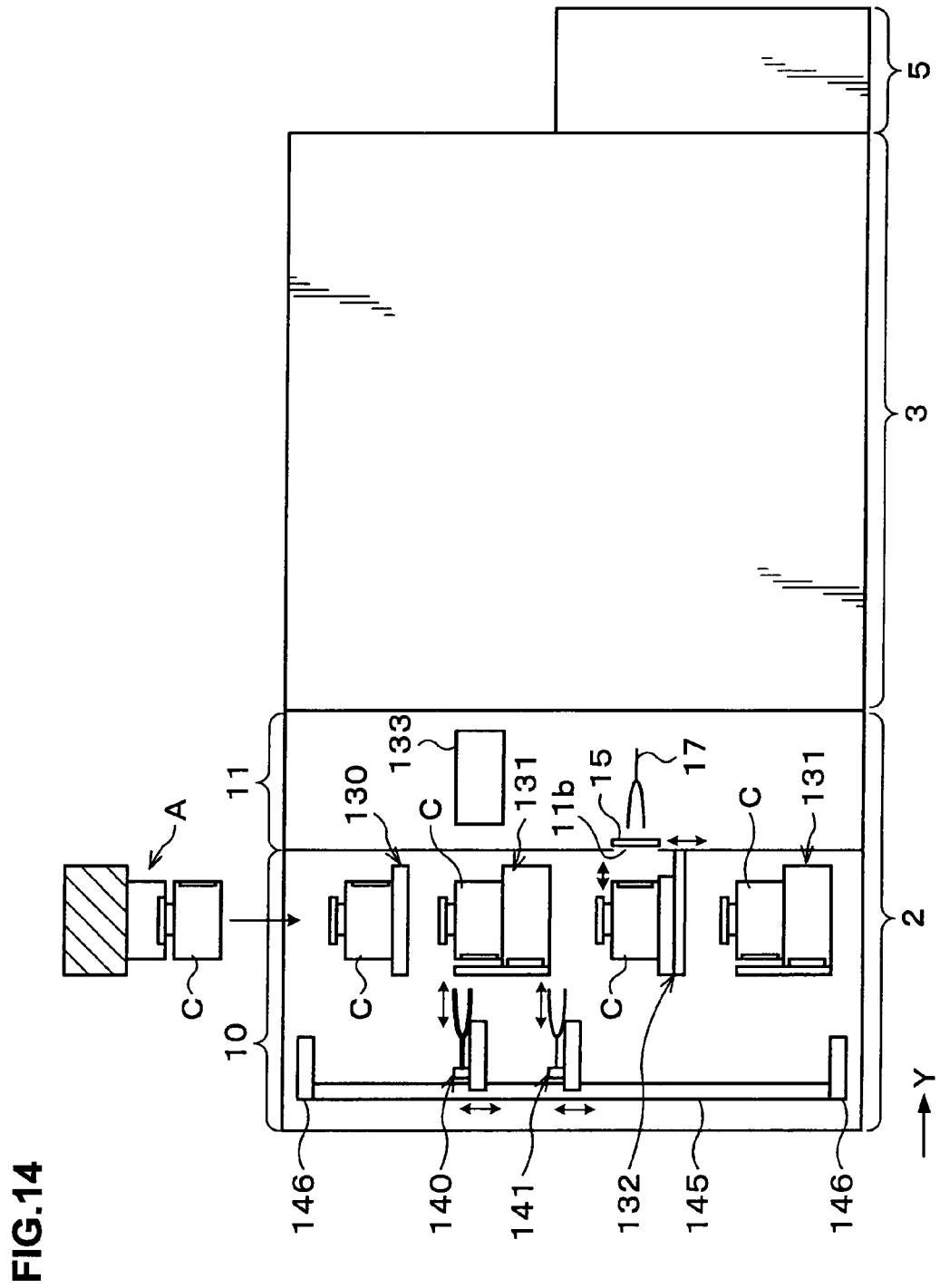
FIG. 14 is a side view showing a configuration of the transfer in/out block when the wafer processing unit is provided in a wafer transfer region.

Though the wafer processing unit 133 is provided only in the wafer mounting region 10 in the above embodiment, it may be provided also in the wafer transfer region 11 as shown in FIG. 14. In this case, the wafers W in the cassette C on the cassette mounting unit 132 may be transferred by the wafer transfer unit 17 to the wafer processing unit 133 in the wafer transfer region 11, and then transferred by the wafer transfer unit 17 to the processing block 3. Also in this case, the waiting time of the wafer W before transferred to the processing block 3 can be utilized to perform the processing for the wafer W.

The coating and developing treatment system 1 described in the above embodiments can cope not only with the cassette C for a typical lot with the number of wafers W housed therein of about 25 but also with a cassette for a small lot with the number of wafers W housed therein of about 12 or 6. Further, in the case of the typical lot, wafers W may be transferred in from the cassette C housing 25 wafers W at the time of transferring in the wafers W, while about 12 wafers W may be housed in the cassette C and transferred to the outside of the system at the time of transferring out the wafers W after processing. This eliminates the necessity of waiting completion of processing for all of 25 wafers W in the same lot, thus making it possible to start post-process in other units earlier.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention. For example, the numbers and the arrangements of the cassette transfer in/out units 110, the cassette waiting units 111, the cassette delivery units 112, and the wafer processing units 113 in the cassette waiting block 6 are not limited to those described in the above embodiments. Further, the numbers and the arrangements of the cassette transfer in/out units 130, the cassette waiting units 131, the cassette mounting units 132, and the wafer processing units 133 in the transfer in/out block 2 are not limited to those described in the above embodiments. Besides, though the wafer processing units 113 and 133 perform temperature regulation processing, they may be units for performing other treatment or processing, such as adhesion treatment and thermal processing performed at an early stage in the photolithography processing. Further, the configurations of the cassette transfer unit 120 and 140 and wafer transfer units 121 and 141 are not limited. For example, the cassette transfer units 120 and 140 may not have the transfer arm but may transfer the cassette by a conveyer in a loop form. Furthermore, the configurations of the processing block 3 and the interface block 5 in the coating and developing treatment system 1 are not limited.

While the substrate processing system in the above embodiments is the coating and developing treatment system for performing photolithography processing, it may be a system for performing other processing. Further, the present invention is also applicable to a processing system for other substrates such as an FPD (Flat Panel Display), a mask reticle for a photomask, and the like other than the semiconductor wafer.

The present invention is useful to increase the processing efficiency of substrates in a substrate processing system.

What is claimed is:

1. A substrate processing system comprising:
a processing block that is configured to process substrates in a single-substrate mode;
a transfer in/out block that is configured to transfer the substrates into/from said processing block, the processing block and the transfer in/out block being adjacent to each other;
said transfer in/out block having a cassette mounting unit that mounts a cassette housing a plurality of substrates on the cassette mounting unit, the transfer in/out block configured to transfer the substrates from/into the cassette on said cassette mounting unit into/from said processing block;
a cassette waiting block provided adjacent to said transfer in/out block; and in said transfer in/out block, further comprising
cassette waiting units configured to store a plurality of cassettes,
a cassette delivery unit configured to deliver the cassette to/from said transfer in/out block, and
a substrate pre-processing unit configured to accept transfer of the substrates from the cassette waiting units and configured to perform pre-processing on the substrates before the cassette is transferred from said transfer in/out block,
wherein the substrate pre-processing unit in said cassette waiting block is configured to accept one substrate at a time from the cassette waiting units for processing therein and performs at least one of temperature regulation processing, adhesion treatment, or thermal processing.

2. The substrate processing system as set forth in claim 1, wherein, in said cassette waiting block, a substrate transfer unit transfers the substrate between the cassette and said substrate processing unit.

3. The substrate processing system as set forth in claim 2, wherein, in said cassette waiting block, a cassette rotating member rotates the cassette to change an orientation of a door of the cassette.

4. The substrate processing system as set forth in claim 2, wherein said cassette waiting unit has an opening/closing mechanism that opens/closes a door of the cassette.

5. The substrate processing system as set forth in claim 2, wherein, in said cassette waiting block, a cassette transfer in/out unit transfers the cassette to/from the outside, and a cassette transfer mechanism that transfers the cassette between said cassette transfer in/out unit, said cassette waiting unit, and said cassette deliver unit.

6. The substrate processing system as set forth in claim 5, wherein said cassette transfer in/out unit and said cassette waiting units are arranged in a vertical direction.

7. The substrate processing system as set forth in claim 6, wherein said cassette transfer in/out unit is provided in an upper portion of said cassette waiting block.

8. A substrate processing system comprising:
a processing block that is configured to process substrates in a single-substrate mode; and
a transfer in/out block that is configured to transfer the substrates into/from said processing block, the processing block and the transfer in/out block being adjacent to each other; and
in said transfer in/out block, further comprising
cassette waiting units configured to store a plurality of cassettes, each cassette capable of housing a plurality of substrates,
a cassette mounting unit configured to mount a cassette on the cassette mounting unit to deliver the substrate to/from said processing block, and
a substrate pre-processing unit configured to accept transfer of the substrates from the cassette waiting units and configured to perform pre-processing on the substrates before being transferred into said processing block,
wherein the substrate pre-processing unit in said transfer in/out block is configured to accept one substrate at a time from the cassette waiting units for processing therein and performs at least one of temperature regulation processing, adhesion treatment, or thermal processing.

9. The substrate processing system as set forth in claim 8, wherein, in said transfer in/out block, a substrate transfer unit transfers the substrate between the cassette in said cassette waiting unit and said substrate processing unit.

10. The substrate processing system as set forth in claim 9, wherein, in said transfer in/out block, a cassette rotating member rotates the cassette to change an orientation of a door of the cassette.

11. The substrate processing system as set forth in claim 9, wherein said cassette waiting unit has an opening/closing mechanism that opens/closes a door of the cassette.

12. The substrate processing system as set forth in claim 9, wherein, in said transfer in/out block, a cassette transfer in/out unit transfers the cassette to/from the outside, and a cassette transfer mechanism that transfers the cassette between said cassette transfer in/out unit, said cassette waiting unit, and said cassette mounting unit.

13. The substrate processing system as set forth in claim 12, wherein said cassette transfer in/out unit and said cassette waiting units are arranged in a vertical direction.

14. The substrate processing system as set forth in claim 13,
wherein said cassette transfer in/out unit is provided in an upper portion of said transfer in/out block.

15. The substrate processing system as set forth in claim 1, wherein the predetermined processing performed by the substrate pre-processing unit is performed before the cassette is transferred into the transfer in/out block and before the substrates are transferred into the processing block comprises temperature regulation processing, adhesion treatment, and thermal processing.

* * * * *